(12) United States Patent
Lindgren et al.

(10) Patent No.: US 6,710,442 B1
(45) Date of Patent: Mar. 23, 2004

(54) MICROELECTRONIC DEVICES WITH IMPROVED HEAT DISSIPATION AND METHODS FOR COOLING MICROELECTRONIC DEVICES

(75) Inventors: Joseph T. Lindgren, Boise, ID (US); Warren M. Farnworth, Nampa, ID (US); William M. Hiatt, Eagle, ID (US); Nishant Sinha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/228,906

(22) Filed: Aug. 27, 2002

(51) Int. Cl.⁷ .......................... H01L 23/10; H01L 23/34
(52) U.S. Cl. ...................................... 257/706
(58) Field of Search .................. 257/77, 675, 706, 257/717, 718, 720, 796

(56) References Cited

U.S. PATENT DOCUMENTS

| 6,180,527 B1 | 1/2001 | Farnworth et al. | |
| 6,577,504 B1 * | 6/2003 | Lofland et al. | 361/709 |
| 2002/0167079 A1 * | 11/2002 | Pu et al. | 257/685 |

OTHER PUBLICATIONS

Garner, Scott D. (Thermacore, Inc.), "Heat pipes for electronics cooling applications," 10 pages, http://www.electronics-cooling.com/Resources/EC_Articles/SEP96/sep96_02.htm (accessed Apr. 4, 2002), Electronics Cooling Magazine, vol. 2, No. 3, Southborough, Massachusetts, Sep. 1996.

Heat Pipe Technology, Inc., "What are Heat Pipes?" 2 pages, http://www.heatpipe.com/heatpipes.htm (accessed Apr. 4, 2002), Gainesville, Florida, Copyright 1996–2001.

Thermacore International, Inc., "Therma–Base™ Heat Sink. Today's Challenge: More Power in Smaller Packages," 2 pages, http://www.thermacore.com/thermabase.htm (accessed Apr. 4, 2002), Lancaster, Pennsylvania.

* cited by examiner

Primary Examiner—Craig A. Thompson
(74) Attorney, Agent, or Firm—Perkins Coie LLP (57) ABSTRACT

Microelectronic devices with improved heat dissipation, methods of making microelectronic devices, and methods of cooling microelectronic devices are disclosed herein. In one embodiment, the microelectronic device includes a microelectronic substrate having a first surface, a second surface facing opposite from the first surface, and a plurality of active devices at least proximate to the first surface. The second surface has a plurality of heat transfer surface features that increase the surface area of the second surface. In another embodiment, an enclosure having a heat sink and a single or multi-phase thermal conductor can be positioned adjacent to the second surface to transfer heat from the active devices.

58 Claims, 5 Drawing Sheets

MICROELECTRONIC DEVICES WITH IMPROVED HEAT DISSIPATION AND METHODS FOR COOLING MICROELECTRONIC DEVICES

TECHNICAL FIELD

The present invention is directed toward microelectronic devices with improved heat dissipation, methods of making microelectronic devices, and methods of cooling microelectronic devices.

BACKGROUND

The current trend in microelectronic device fabrication is to manufacture smaller and faster microelectronic devices for computers, cell phones, pagers, personal digital assistants, and many other products. All microelectronic devices generate heat, and rejection of this heat is necessary for optimum and reliable operation. As the speed and capacity of microelectronic devices has increased, the integrated circuitry of the devices has become smaller and more closely spaced, thereby generating more heat. Moreover, the cooling space within the microelectronic devices has become smaller. Accordingly, heat dissipation has become a critical design factor.

Figure 1A:
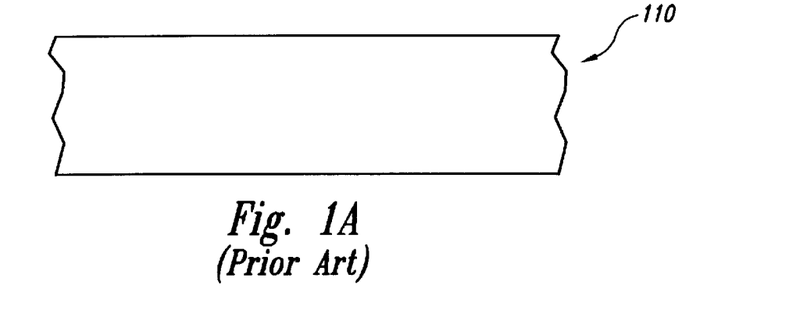
FIG. 1A is a schematic side view of a wafer in accordance with the prior art.
Figure 1B:
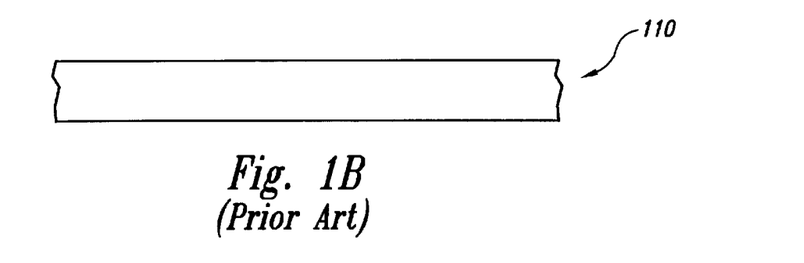
FIG. 1B is a schematic side view of the wafer shown in FIG. 1A after thinning in accordance with the prior art.
Figure 1C:
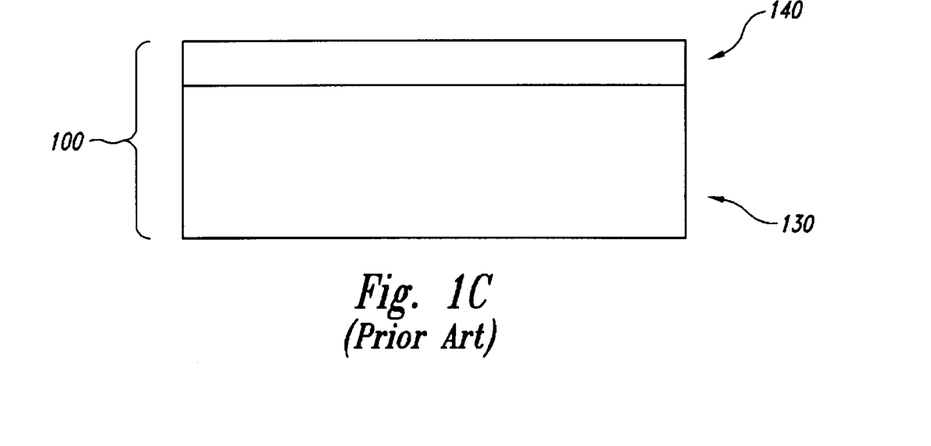
FIG. 1C is a schematic side view of a microelectronic device including a portion of the wafer and a heat sink in accordance with the prior art.

FIGS. 1A–1C schematically illustrate an existing method for dissipating heat from devices formed on a wafer 110. FIG. 1A is a schematic side view of the wafer 110, and FIG. 1B is a schematic side view of the wafer 110 thinned, for example, in accordance with the procedures disclosed in U.S. Pat. No. 6,180,527, assigned to the assignee of the present invention and incorporated herein by reference. Thinning the wafer 110 increases the surface area per unit volume of the wafer 110, and therefore the ability of the wafer 110 to reject heat. FIG. 1C illustrates a microelectronic device 100 including a portion of the diced wafer 110, such as a microelectronic die 140, and a heat sink 130 attached to the die 140. In operation, the heat sink 130 absorbs heat from the die 140 and dissipates the heat into the ambient air. In one embodiment, a cooling fan can be added to force air past the heat sink 130.

Another method for dissipating heat from the die 140 includes attaching a heat pipe (not shown) to the surface of the die 140. A heat pipe typically includes a closed, evacuated vessel with a working fluid inside. One end of the heat pipe is positioned to absorb heat from the die 140. The heat causes the fluid in the heat pipe to vaporize and create a pressure gradient in the pipe. This pressure gradient forces the vapor to flow along the heat pipe to a cooler section where it condenses, giving up its latent heat of vaporization. The cooler section of the heat pipe then dissipates the heat into the ambient air. The working fluid then returns to the end of the heat pipe proximate to the die 140.

The foregoing heat dissipation methods have several drawbacks. For example, attaching a heat sink, heat pipe, and/or cooling fan to the microelectronic device may substantially increase the weight and/or size of the device. Furthermore, the limited contact area between the die and the heat sink or heat pipe may limit the heat transfer between the devices.

SUMMARY

The present invention is directed toward microelectronic devices with improved heat dissipation, methods of making microelectronic devices, and methods of cooling microelectronic devices. In one aspect of the invention, a microelectronic device includes a microelectronic substrate having a first surface, a second surface facing opposite from the first surface, and a plurality of active devices at least proximate to the first surface. The second surface has a plurality of heat transfer surface features. In a further aspect of the invention, the second surface has a projected area and a surface area, including the heat transfer surface features, that is greater than the projected area. In yet a further aspect of the invention, the heat transfer surface features are not configured to provide electrical communication between the microelectronic substrate and components external to the microelectronic substrate. In a further aspect of the invention, the heat transfer surface features are integrally formed in the second surface.

In another aspect of the invention, the second surface of the microelectronic substrate defines at least in part a thermal conductor volume. The microelectronic device further includes an enclosure member sealably coupled to the microelectronic substrate, and a thermal conductor disposed within the thermal conductor volume to transfer heat from the active devices. In a further aspect of the invention, the second surface has a plurality of recesses. The microelectronic device further includes a sealed heat transport system coupled to the second surface of the microelectronic substrate. The heat transport system has a cavity with a thermal conductor configured to transfer heat from the microelectronic substrate to a region external to the microelectronic substrate, and the thermal conductor is sealably excluded from the recesses.

In another aspect of the invention, a method for making the microelectronic device includes forming active devices at least proximate to the first surface of the microelectronic substrate, and removing material from the second surface of the microelectronic substrate to form heat transfer surface features. In a further aspect of the invention, the method includes forming at least one recess in the second surface of the microelectronic substrate, and disposing the thermal conductor in the at least one recess. The thermal conductor is not configured to provide electrical communication between the microelectronic substrate and external components. The method further includes sealably enclosing the at least one recess with the thermal conductor positioned to transfer heat from the active devices to a region external to the microelectronic substrate.

In yet another aspect of the invention, a method for cooling the microelectronic device includes providing a microelectronic substrate having a first surface, a second surface with at least one recess, and a plurality of active devices at least proximate to the first surface. The method further includes vaporizing at least some of a liquid positioned in the at least one recess as the liquid absorbs heat from the microelectronic substrate, and condensing at least some of the vaporized liquid by transferring heat away from the microelectronic substrate.

DETAILED DESCRIPTION

The present disclosure describes microelectronic devices with increased heat dissipation, methods for manufacturing microelectronic devices, and methods for cooling microelectronic devices. Many specific details of several embodiments of the invention are set forth in the following description and in FIGS. 2A–6 to provide a thorough understanding of such embodiments. Those of ordinary skill in the art, however, will understand that the invention can have additional embodiments, and that the invention may be practiced without several of the details described below.

Figure 2A:
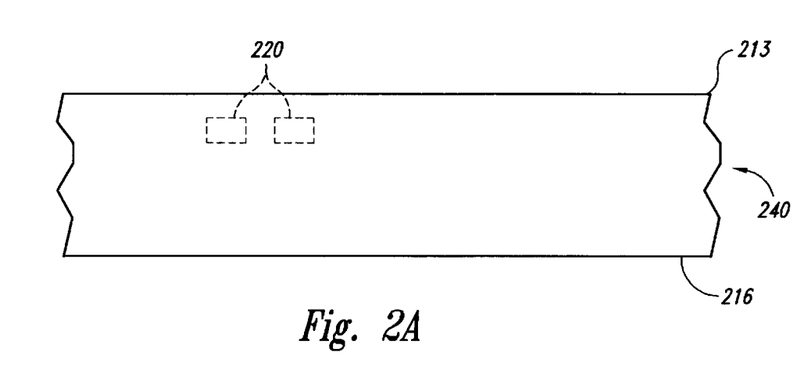
FIG. 2A is a schematic side view of a substrate positioned for processing in accordance with an embodiment of the invention.

FIG. 2A is a schematic side view of a microelectronic substrate 240, such as a wafer, prior to processing in accordance with an embodiment of the invention. The microelectronic substrate 240 can include a first surface 213 and a second surface 216 facing opposite from the first surface 213. As used herein, the term "microelectronic substrate" includes substrates (such as wafers and/or dies diced from wafers) upon which and/or in which microelectronic circuits or components, data storage elements or layers, and/or vias or conductive lines are or can be fabricated. The microelectronic substrate 240 can include active devices 220, such as capacitors, transistors, and/or memory cells, proximate to the first surface 213. In operation, the active devices 220 generate heat that must be dissipated to obtain the desired operational characteristics from the devices 220.

Figure 2B:
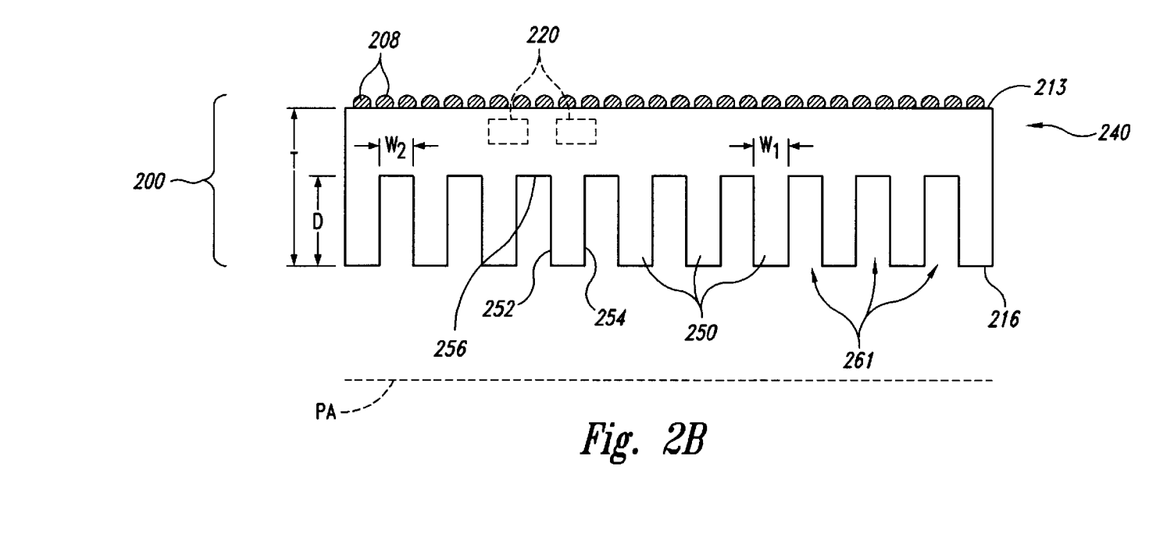
FIG. 2B is a schematic side view of a microelectronic device formed from the substrate shown in FIG. 2A having heat transfer surface features in accordance with an embodiment of the invention.

FIG. 2B is a schematic side view of a microelectronic device 200, that includes the microelectronic substrate 240 and a plurality of heat transfer surface features 250 in accordance with one embodiment of the invention. In one aspect of this embodiment, the microelectronic substrate 240 can be modified (for example, by thinning the microelectronic substrate 240 in accordance with procedures described in U.S. Pat. No. 6,180,527) before the formation of the heat transfer surface features 250. In other embodiments, the microelectronic substrate 240 is not thinned. In either embodiment, the heat transfer surface features 250 increase the surface area of the second surface 216 of the microelectronic substrate 240. For example, the second surface 216 has a projected area PA generally parallel to the first surface 213. The surface area of the second surface 216 including the heat transfer surface features 250 is greater than the projected area PA and this increased surface area can enhance the ability of the microelectronic substrate 240 to dissipate heat.

In one embodiment, the heat transfer surface features 250 include grooves 261 that permit a heat transfer medium, such as air, to have increased thermal contact with the microelectronic substrate 240, thereby increasing the amount of heat transferred from the microelectronic substrate 240. In one aspect of this embodiment, each heat transfer surface feature 250 includes a first heat transfer wall 252, a second heat transfer wall 254, and a portion of the second surface 216. In a further aspect of this embodiment, the first and second heat transfer walls 252 and 254 can be generally parallel, and each wall can extend from the second surface 216 to a recessed surface 256. In other embodiments, (such as an embodiment described below with reference to FIG. 4), the heat transfer walls can be non-parallel.

In a further aspect of an embodiment illustrated in FIG. 2B, each heat transfer surface feature 250 has a generally similar shape and size. For example, the heat transfer surface features 250 can be disposed in a portion of the microelectronic substrate 240 having a thickness T, and each surface feature 250 can have a depth D and a width $W_1$, and can be spaced apart from the adjacent surface feature 250 by a distance $W_2$. In one embodiment, D is approximately 400 microns and T is approximately 750 microns. In another embodiment, D is from about one-fifth to about three-fourths the value of T. In still a further embodiment, D is from about one-third to about one-half the value of T. In additional embodiments, D, T, $W_1$, and $W_2$ can have other values depending on the heat transfer requirements and available volume of the microelectronic substrate 240.

In one embodiment, the heat transfer surface features 250 are not configured to provide electrical communication between the microelectronic substrate 240 and components external to the microelectronic substrate 240. This function can instead be provided by electrical couplers 208, such as solder balls, which are electrically coupled to the active devices 220. In another embodiment, the heat transfer surface features 250 can be integrally formed in the microelectronic substrate 240. For example, the heat transfer surface features 250 can be formed by removing material from the second surface 216 (such as by etching) to create the grooves 261. In other embodiments, the heat transfer surface features 250 can be formed by depositing material on the second surface 216.

In operation, the active devices 220 generate heat that flows through the microelectronic substrate 240, primarily by conduction, and is transferred away from the substrate 240 by convection, conduction and/or radiation. For example, a heat transfer medium, such as air, can move proximate to the heat transfer surface features 250 to absorb heat from the microelectronic substrate 240. The heat transfer surface features 250 increase the rate at which heat is transferred away from the microelectronic substrate 240 by increasing the surface area of the substrate 240. One advantage of this arrangement is that the microelectronic substrate 240 can be cooled without the addition of a heat sink. In other embodiments (such as those described below with reference to FIGS. 5 and 6), heat sinks can further increase the rate at which heat is transferred from the microelectronic substrate.

Figure 3:
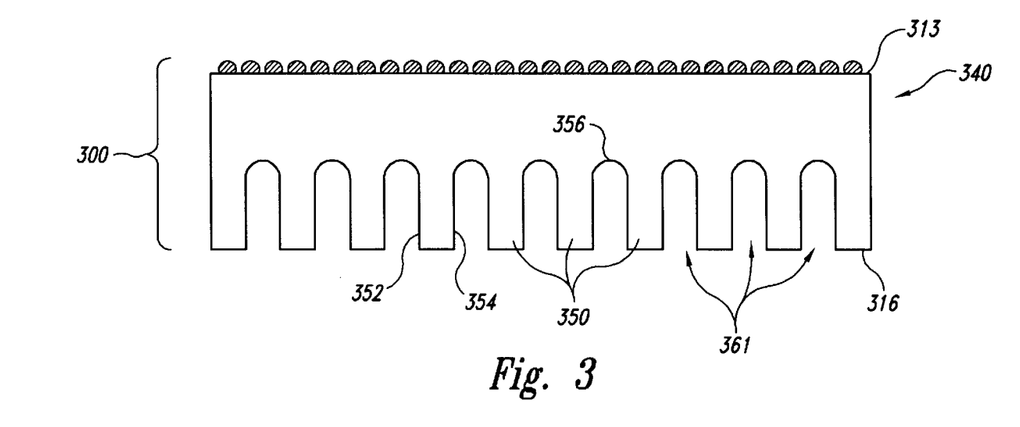
FIG. 3 is a schematic side view of a microelectronic device having heat transfer surface features in accordance with another embodiment of the invention.

FIG. 3 is a schematic side view of a microelectronic device 300 having heat transfer surface features 350 in accordance with another embodiment of the invention. In one aspect of this embodiment, the microelectronic device 300 includes a microelectronic substrate 340 having a first surface 313, a second surface 316, and a plurality of heat transfer surface features 350 formed in the second surface 316 to increase the surface area and enhance the ability of the substrate 340 to dissipate heat. Grooves 361 separate the heat transfer surface features 350 from each other. Each heat transfer surface feature 350 can include a first heat transfer wall 352, a second heat transfer wall 354, and a portion of the second surface 316. In the illustrated embodiment, the first and second heat transfer walls 352 and 354 are generally parallel, and each wall 352 and 354 extends from the second surface 316 to a recessed surface 356. The recessed surface 356 has an arcuate shape, curving between the first heat transfer wall 352 of one heat transfer surface feature 350 and the second heat transfer wall 354 of an adjacent heat transfer surface feature 350.

Figure 4:
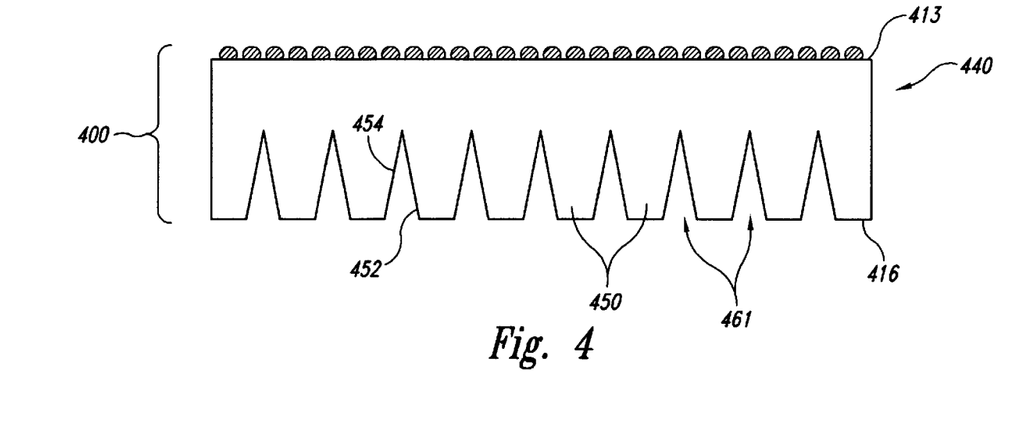
FIG. 4 is a schematic side view of a microelectronic device having heat transfer surface features in accordance with yet another embodiment of the invention.

FIG. 4 is a schematic side view of a microelectronic device 400 having heat transfer surface features 450 in accordance with another embodiment of the invention. In one aspect of this embodiment, the microelectronic device 400 includes a microelectronic substrate 440 having a first surface 413, a second surface 416, and a plurality of heat transfer surface features 450 formed in the second surface 416. Grooves 461 separate the heat transfer surface features 450 from each other. Each heat transfer surface feature 450 can include a first heat transfer wall 452, a second heat transfer wall 454, and a portion of the second surface 416. In the illustrated embodiment, the first heat transfer wall 452 of one heat transfer surface feature 450 and the second heat transfer wall 454 of an adjacent heat transfer surface feature 450 are nonparallel to each other. The distance between the first heat transfer wall 452 and the second heat transfer wall 454 decreases as the walls 452 and 454 extend from the second surface 416 toward the first surface 413. In other embodiments, heat transfer surface features with other shapes and/or sizes can be used to increase the surface area of the microelectronic substrate.

Figure 5:
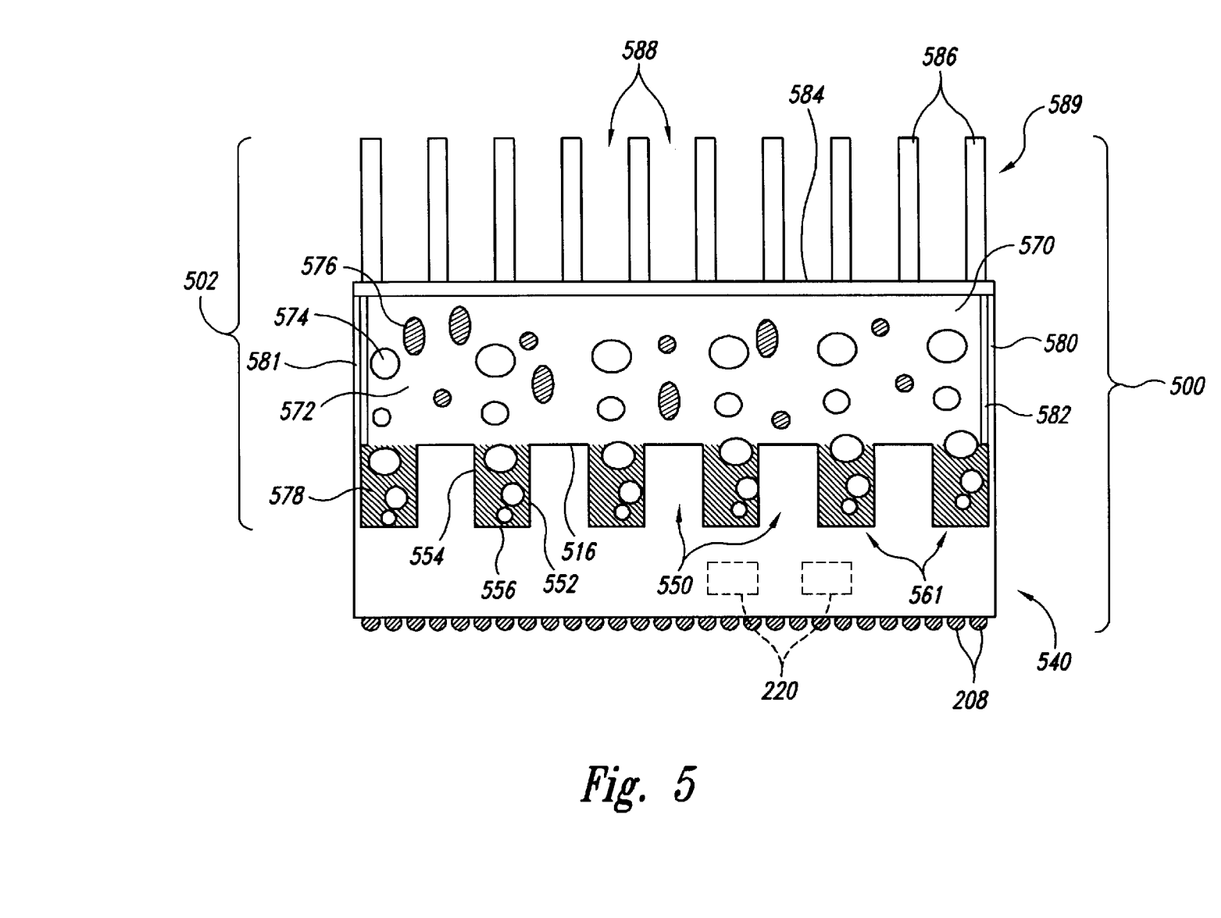
FIG. 5 is a schematic side view of a microelectronic device including a heat dissipation system in accordance with another embodiment of the invention.

FIG. 5 is a schematic side view of a microelectronic device 500 including a microelectronic substrate 540 having active devices 220 and a heat dissipation system 502. In the illustrated embodiment, the microelectronic substrate 540 is similar to the microelectronic substrate 240 discussed above with reference to FIG. 2B. For example, the microelectronic substrate 540 can include heat transfer surface features 550, separated by grooves 561, and having first heat transfer walls 552, second heat transfer walls 554, and recessed surfaces 556 recessed from a second surface 516. In other embodiments, the microelectronic substrate 540 can have other configurations, such as those discussed above with reference to FIGS. 3 and 4. In any of these embodiments, the heat dissipation system 502 can transfer heat from the microelectronic substrate 540 to an external heat sink 589. For example, the heat dissipation system 502 of the illustrated embodiment can include a thermal conductor 572 disposed within a thermal conductor volume 570 and arranged to transfer heat to the external heat sink 589. The thermal conductor volume 570 can be defined by a first side wall 580, a second side wall 581, an enclosure member 584, and portions of the microelectronic substrate 540, such as the first and second heat transfer walls 552 and 554 and the recessed surfaces 556 of the heat transfer features 550.

The thermal conductor 572 is positioned within the thermal conductor volume 570 to absorb heat from the microelectronic substrate 540. In the illustrated embodiment, the thermal conductor 572 has multiple phases within the thermal conductor volume 570. For example, the thermal conductor 572 can include a liquid phase portion 578 disposed primarily within the grooves 561, and a gas phase portion 574 disposed primarily between the first side wall 580 and the second side wall 581. In one embodiment, the thermal conductor 572 can include water, ammonia, and/or alcohol. In other embodiments, the thermal conductor 572 can include other substances and/or can have other single or multi-phase compositions. For example, the thermal conductor 572 can include only a solid phase material, or only a gas-phase material, or a portion of the thermal conductor 572 can include a solid phase and another portion can include a liquid or a gas phase. In one embodiment, the thermal conductor volume 570 can have a negative gauge pressure so that the thermal conductor 572 can more easily vaporize. In other embodiments, the thermal conductor volume 570 can have other pressures. In any of those embodiments, the thermal conductor 572 can transfer heat from the heat transfer surface features 550 to the enclosure member 584.

The enclosure member 584 absorbs heat from the thermal conductor 572 and transfers the heat to the external heat sink 589. In the illustrated embodiment, the enclosure member 584 is sealably coupled to the first and second side walls 580 and 581, which are integral portions of the microelectronic substrate 540. In other embodiments, the first and second side walls 580 and 581 can be integral portions of the enclosure member 584, or the walls 580 and 581 can initially be separate from the enclosure member 584 and the microelectronic substrate 540. In any of these embodiments, the external heat sink 589 can include a plurality of fins 586 to transfer heat to an external medium, such as the surrounding air. In the illustrated embodiment, the external medium can move through channels 588 between the heat fins 586. In other embodiments, the heat dissipation system 502 may not include heat fins 586.

In operation, the active devices 220 generate heat that flows through the microelectronic substrate 540 to the heat transfer surface features 550. Accordingly, the first and second heat transfer walls 552 and 554, the recessed surfaces 556, and the second surface 516 transfer heat to the thermal conductor 572. In the illustrated embodiment, the liquid phase portion 578 of the thermal conductor 572 in the grooves 561 absorbs heat from the first and second heat transfer walls 552 and 554 and the recessed surfaces 556. As the liquid phase portion 578 absorbs heat, it vaporizes and transforms into the gas phase portion 574. The gas phase portion 574 may form proximate to the recessed surface 556 because the surface 556 is close to the hot active devices 220. After formation, the gas phase portion 574 rises out of the liquid phase portion 578 toward the enclosure member 584. As the gas phase portion 574 approaches and/or contacts the enclosure member 584, the gas phase portion 574 transfers heat to the enclosure member 584 and condenses. Drops of condensate 576 fall downward toward the grooves 561 and form part of the liquid phase portion 578 in the grooves 561. As the process repeats, heat is transferred from the microelectronic substrate 540 to the enclosure member 584 and from the enclosure member 584 to the environment external to the microelectronic substrate 540. An advantage of this arrangement is the rate at which heat is transferred from the microelectronic substrate 540 can be increased due to the large surface area added by the heat sink 589 and the heat transfer surface features 550.

The heat dissipation system 502 of the illustrated embodiment can include wicks 582 to ensure that the liquid phase portion 578 of the thermal conductor 572 returns proximate to the microelectronic substrate 540 independent of the orientation of the system 502 with respect to gravitational forces, or other forces, such as centrifugal forces. In one aspect of this embodiment, the wicks 582 are positioned proximate to the first and second side walls 580 and 581. If the microelectronic device 500 is oriented such that gravity does not pull the drops of condensate 576 toward the grooves 561, the wicks 582 will return the liquid phase portion 578 to the microelectronic substrate 540 via capillary action. Other embodiments, such as those in which the grooves 561 are consistently oriented beneath the enclosure member 584, may not include wicks 582.

Figure 6:
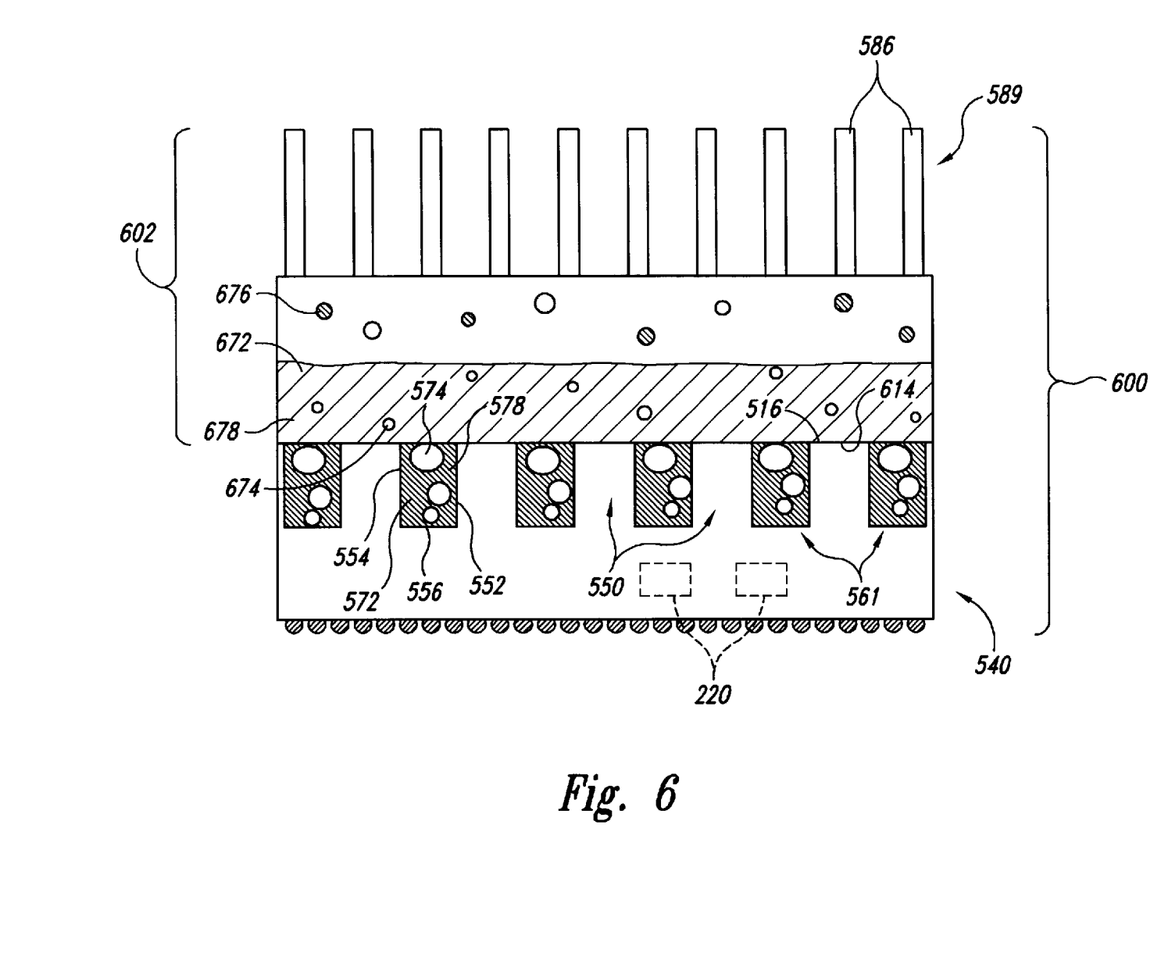
FIG. 6 is a schematic side view of a microelectronic device including a sealed heat transport system in accordance with another embodiment of the invention.

FIG. 6 is a schematic side view of a microelectronic device 600 in which the microelectronic substrate 540 attached to a sealed heat transport system 602. The sealed heat transport system 602 transfers heat from the microelectronic substrate 540 to the external heat sink 589. Suitable sealed heat transport systems 602 include Therma-Base Heat Sinks manufactured by Thermacore International, Inc. of Lancaster, Pa. In one embodiment, the sealed heat transport system 602 absorbs heat from the microelectronic substrate 540 via a first thermal conductor 572 and dissipates the heat via the external heat sink 589. In one embodiment, the external heat sink 589 can include fins 586 and in other embodiments, the fins 586 are eliminated. In any of these embodiments, the sealed heat transport system 602 can include an internal, single or multi-phase second thermal conductor 672 that transfers heat from the first thermal conductor 572 and the microelectronic substrate 540 to the external heat sink 589. For example, the second thermal conductor can include a liquid phase portion 678, a gas phase portion 674 and a precipitate portion 676.

The sealed heat transport system 602 can be attached to the microelectronic substrate 540 proximate to the grooves 561. In one embodiment, the sealed heat transport system 602 is attached to the second surface 516 of the microelectronic substrate 540 with an adhesive, such as a nitride adhesive that prevents the first thermal conductor 572 from leaking out of the grooves 561. In one aspect of this embodiment, the first thermal conductor 572 can include the liquid phase portion 578 and the gas phase portion 574, as described above with reference to FIG. 5. In other embodiments, the first thermal conductor 572 can have other single or multi-phase compositions, also as described above with reference to FIG. 5. In any of these embodiments, the first thermal conductor 572 is physically isolated with a membrane from the second thermal conductor 672, but can transfer heat to the second thermal conductor 672.

In operation, the active devices 220 generate heat which flows through the microelectronic substrate 540 to the heat transfer surface features 550. A first surface 614 of the sealed heat transport system 602 absorbs some of the heat directly from the microelectronic substrate 540. The first thermal conductor 572 in the grooves 561 also absorbs heat through the first heat transfer walls 552, the second heat transfer walls 554, and the recessed surfaces 556. In the illustrated embodiment, the liquid phase portion 578 absorbs heat and vaporizes, forming the gas phase portion 574. The heated first thermal conductor 572 transfers the heat to the first surface 614 of the sealed heat transport system 602. As the process repeats, heat is transferred from the microelectronic substrate 540 to the sealed heat transport system 602, and from the sealed heat transport system 602 to the external heat sink 589.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A microelectronic device, comprising a microelectronic substrate having a first surface, a second surface facing opposite from the first surface, and a plurality of active devices at least proximate to the first surface, the second surface having a projected area and a plurality of heat transfer surface features integrally formed in the second surface, wherein a surface area of the second surface including the heat transfer surface features is greater than the projected area.

2. The device of claim 1 wherein the first and second surfaces of the microelectronic substrate are generally parallel and wherein the projected area is generally parallel to the first surface.

3. The device of claim 1 wherein the heat transfer surface features are at least partially defined by a plurality of recesses.

4. The device of claim 1 wherein the heat transfer surface features extend a distance approximately equal to one-third to one-half of a distance between the first and second surfaces of the microelectronic substrate.

5. The device of claim 1 wherein at least one heat transfer surface feature includes a first wall, a second wall, and a portion of the second surface between the first wall and the second wall, the first wall defining a first plane, the second wall defining a second plane generally nonparallel to the first plane.

6. The device of claim 1 wherein at least one heat transfer surface feature includes a first wall, a second wall, and a portion of the second surface between the first wall and the second wall, the first wall defining a first plane, the second wall defining a second plane generally parallel to the first plane.

7. The device of claim 1 wherein the microelectronic substrate includes a microelectronic die.

8. The device of claim 1 wherein at least one heat transfer surface feature includes a projection.

9. The device of claim 1, further comprising a plurality of solder balls coupled to the microelectronic substrate.

10. The device of claim 1, further comprising a plurality of electrical couplers electrically coupled to the active devices and configured to provide electrical communication between the microelectronic substrate and external components.

11. A microelectronic device, comprising a microelectronic substrate having a first surface, a second surface facing opposite from the first surface, and a plurality of active devices at least proximate to the first surface, the second surface having a projected area and a plurality of heat transfer surface features, wherein a surface area of the second surface including the heat transfer surface features is greater than the projected area.

12. The device of claim 11 wherein the first and second surfaces of the microelectronic substrate are generally parallel and wherein the projected area is generally parallel to the first surface.

13. The device of claim 11 wherein the heat transfer surface features are at least partially defined by a plurality of recesses.

14. The device of claim 11 wherein at least one heat transfer surface feature includes a projection.

15. A microelectronic device, comprising a microelectronic substrate having a first surface, a second surface facing opposite from the first surface, and a plurality of active devices at least proximate to the first surface, the second surface having a plurality of heat transfer surface features, wherein the heat transfer surface features are not configured to provide electrical communication between the microelectronic substrate and components external to the microelectronic substrate.

16. The device of claim 15 wherein at least one heat transfer feature is integrally formed in the second surface.

17. The device of claim 15 wherein the first and second surfaces of the microelectronic substrate are generally parallel and wherein the projected area is generally parallel to the first surface.

18. The device of claim 15 wherein the heat transfer surface features are at least partially defined by a plurality of recesses.

19. The device of claim 15 wherein the heat transfer surface features extend a distance approximately equal to one-third to one-half of a distance between the first and second surfaces of the microelectronic substrate.

20. The device of claim 15 wherein at least one heat transfer surface feature includes a first wall, a second wall, and a portion of the second surface between the first wall and the second wall, the first wall defining a first plane, the second wall defining a second plane generally nonparallel to the first plane.

21. The device of claim 15 wherein at least one heat transfer surface feature includes a first wall, a second wall, and a portion of the second surface between the first wall and the second wall, the first wall defining a first plane, the second wall defining a second plane generally parallel to the first plane.

22. The device of claim 15 wherein the microelectronic substrate includes a microelectronic die.

23. The device of claim 15 wherein at least one heat transfer surface feature includes a projection.

24. The device of claim 15, further comprising a plurality of solder balls coupled to the microelectronic substrate.

25. The device of claim 15, further comprising a plurality of electrical couplers electrically coupled to the active devices and configured to provide electrical communication between the microelectronic substrate and external components.

26. A microelectronic device, comprising:
a microelectronic substrate having a first surface, a second surface facing opposite to the first surface, a first side wall extending generally transverse to the second surface, a second side wall extending generally transverse to the second surface, and a plurality of active devices at least proximate to the first surface, wherein the first side wall, the second side wall, and the second surface define at least in part a thermal conductor volume; and
an enclosure member sealably coupled to the microelectronic substrate to enclose the thermal conductor volume.

27. The device of claim 26 wherein the microelectronic substrate includes a microelectronic die.

28. The device of claim 26, further comprising a thermal conductor disposed within the thermal conductor volume.

29. The device of claim 26, further comprising a thermal conductor disposed within the thermal conductor volume, the thermal conductor including a first portion and a second portion, wherein the first portion is of a different phase than the second portion.

30. The device of claim 26, further comprising at least one wick disposed at least partially within the thermal conductor volume.

31. The device of claim 26 wherein the enclosure member includes a plurality of fins.

32. The device of claim 26 wherein the thermal conductor volume extends into at least one groove in the microelectronic substrate.

33. The device of claim 26 wherein the second surface has a projected area in a plane generally parallel to the first surface, and wherein the second surface includes a plurality of integrally formed heat transfer surface features, further wherein a surface area of the second surface including the heat transfer surface features is greater than the projected area.

34. A microelectronic device, comprising:
a microelectronic substrate having a first surface, a second surface facing opposite from the first surface, and a plurality of active devices at least proximate to the first surface, the second surface defining at least in part a thermal conductor volume;
an enclosure member sealably coupled to the microelectronic substrate to enclose the thermal conductor volume; and
a thermal conductor disposed within the thermal conductor volume.

35. The device of claim 34 wherein the microelectronic substrate includes a microelectronic die.

36. The device of claim 34 wherein the thermal conductor volume includes at least one groove in the microelectronic substrate.

37. The device of claim 34 wherein the thermal conductor includes a thermally conductive solid material.

38. The device of claim 34 wherein the thermal conductor includes a thermally conductive liquid.

39. The device of claim 34 wherein the thermal conductor includes a thermally conductive gas.

40. The device of claim 34 wherein the thermal conductor includes a liquid, and wherein at least some of the liquid is positioned and configured to absorb heat from the microelectronic substrate, vaporize, transfer heat to the enclosure member, and condense.

41. The device of claim 34 wherein the thermal conductor includes a liquid, and wherein the device further comprises a wick disposed at least partially within the thermal conductor volume.

42. The device of claim 34 wherein the enclosure member includes a plurality of heat fins.

43. The device of claim 34 wherein the thermal conductor includes at least one of water, ammonia, and alcohol.

44. The device of claim 34 wherein a pressure within the thermal conductor volume is less than atmospheric pressure.

45. The device of claim 34 wherein the second surface has a plurality of recesses which define a portion of the thermal conductor volume.

46. The device of claim 34 wherein the second surface has a projected area in a plane generally parallel to the first surface, and wherein the second surface includes a plurality of integrally formed heat transfer surface features, further wherein a surface area of the second surface including the heat transfer surface features is greater than the projected area.

47. A microelectronic device, comprising:
a microelectronic substrate having a first surface, a second surface facing opposite the first surface, and a plurality of active devices at least proximate to the first surface, the second surface having a plurality of recesses; and
a sealed heat transport system coupled to the second surface of the microelectronic substrate, the heat transport system having a cavity with a thermal conductor configured to transfer heat from the microelectronic substrate to a region external to the microelectronic substrate, the thermal conductor being sealably excluded from the recesses.

48. The device of claim 47 wherein the thermal conductor includes a thermally conductive solid.

49. The device of claim 47 wherein the thermal conductor includes a thermally conductive gas.

50. The device of claim 47 wherein the thermal conductor includes a thermally conductive liquid.

51. The device of claim 47 wherein the thermal conductor includes a liquid positioned and configured to absorb heat from a first portion of the sealed heat transport system, vaporize, transfer heat at least proximate to a second portion of the sealed heat transport system, and condense.

52. The device of claim 47 wherein the plurality of recesses includes grooves.

53. The device of claim 47 wherein the thermal conductor is the second of at least two thermal conductors, and wherein the device further comprises a first thermal conductor disposed within at least one of the recesses.

54. The device of claim 47 wherein the thermal conductor is the second of at least two thermal conductors, and wherein the device further comprises a first thermal conductor disposed within at least one of the recesses, and wherein the first thermal conductor includes a liquid.

55. The device of claim 47 wherein the thermal conductor is the second of at least two thermal conductors, and wherein the device further comprises a first thermal conductor disposed within at least one of the recesses, and wherein the first thermal conductor includes a thermally conductive solid.

56. The device of claim 47 wherein the thermal conductor is the second of at least two thermal conductors, and wherein the device further comprises a first thermal conductor disposed within at least one of the recesses, and wherein the first thermal conductor includes a gas.

57. The device of claim 47 wherein the thermal conductor is the second of at least two thermal conductors, and wherein the device further comprises a first thermal conductor disposed within at least one of the recesses, and wherein the first thermal conductor includes a liquid positioned and configured to absorb heat from the microelectronic substrate, vaporize, transfer heat to the sealed heat transport system, and condense.

58. The device of claim 47 wherein the sealed heat transport system includes a plurality of fins.

* * * * *